(12) United States Patent
Naffziger et al.

(10) Patent No.: US 9,052,359 B2
(45) Date of Patent: Jun. 9, 2015

(54) METHOD AND SYSTEM FOR VARYING SAMPLING FREQUENCY TO AVOID SOFTWARE HARMONICS WHEN SAMPLING DIGITAL POWER INDICATORS

(75) Inventors: Samuel D. Naffziger, Fort Collins, CO (US); Suresh B. Periyacheri, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 1255 days.

(21) Appl. No.: 12/917,947

(22) Filed: Nov. 2, 2010

(65) Prior Publication Data

US 2012/0105050 A1    May 3, 2012

(51) Int. Cl.
*G06F 1/32* (2006.01)
*G01R 31/317* (2006.01)

(52) U.S. Cl.
CPC ....... *G01R 31/31721* (2013.01); *Y02B 60/1217* (2013.01); *Y02B 60/10* (2013.01); *G06F 1/3203* (2013.01); *Y02B 60/12* (2013.01); *G06F 1/3234* (2013.01); *G06F 1/3206* (2013.01)

(58) Field of Classification Search
CPC .............. G06F 17/5036; G06F 1/3203; G01R 19/2513; G01R 21/133; G01R 21/31708; G01R 21/1331; G01R 22/00; G01R 19/0084; G01R 31/31721
See application file for complete search history.

(56) References Cited

U.S. PATENT DOCUMENTS

| | | |
|---|---|---|
| 4,626,827 A | 12/1986 | Kitamura |
| 6,937,176 B2 | 8/2005 | Freeman |
| 2009/0259869 A1* | 10/2009 | Naffziger ............... 713/340 |

OTHER PUBLICATIONS

U.S. Appl. No. 12/917,928 entitled "Method and System of Sampling to Automatically Scale Digital Power Estimates with Frequency", filed Nov. 2, 2010.

* cited by examiner

*Primary Examiner* — Janet Suglo
*Assistant Examiner* — L. Anderson
(74) *Attorney, Agent, or Firm* — Meyertons Hood Kivlin Kowert & Goetzel

(57) ABSTRACT

A method and system for varying sampling frequency to avoid software harmonics when sampling digital power indicators are described herein. A power monitor may repetitively sample, at a variable sampling rate based on a variable delay time, multiple signals of an IC device to obtain energy values. The variable delay time may be based on a pseudo-random value or a predictable value. The variable delay time may indicate a number of delay cycles that may be inserted between the repetitive samples of the energy values. The variable number of delay cycles between energy value samples may produce a variable sampling rate. A variable sampling rate may avoid alignment with software harmonics which can cause an inaccurate representation of power consumption. The multiple samples obtained by repetitively sampling energy value for the portion of the IC may be summed to generate a cumulative energy value for the portion of the IC.

22 Claims, 5 Drawing Sheets

METHOD AND SYSTEM FOR VARYING SAMPLING FREQUENCY TO AVOID SOFTWARE HARMONICS WHEN SAMPLING DIGITAL POWER INDICATORS

BACKGROUND

1. Technical Field

This disclosure relates to power usage estimation and, more particularly, to power usage estimation in an integrated circuit device using digital techniques.

2. Description of the Related Art

Many modern processors are capable of consuming a great deal of power and in so doing may generate a significant amount of heat. If left unchecked, this heat could cause catastrophic damage to the processor. Thus, power management systems have been developed to limit the power the processor consumes and thus the heat generated. In many power management systems, the thermal design power (TDP) for the entire integrated circuit (IC) device is commonly the primary metric that is used to control power consumption by the IC and to ensure that thermal limits of the IC are not exceeded. Typically, if the thermal limits are being reached, or the thermal power reaches a particular threshold, the power management system may throttle the IC by reducing performance. Conversely, if power consumption can be accurately measured while running a given application, and the power used is less than the TDP capability of the platform, performance may be increased by allowing the IC to consume the available headroom in the TDP by increasing the operating voltage, the operating frequency or both. However, the capabilities of conventional thermal measurement mechanisms have less than acceptable granularity and repeatability in many cases. In addition, conventional analog power measurement typically requires complex analog-to-digital converters and associated circuitry.

SUMMARY OF EMBODIMENTS OF THE PRESENT DISCLOSURE

Various embodiments of a method and system for varying sample frequency to avoid software harmonics when sampling digital power indicators are disclosed. Broadly speaking, estimating power on an integrated circuit device using digital techniques may require granularity and precision. Accordingly, power monitors have been developed that may monitor a set of signals in the integrated circuit device for specific activity. Each such signal may correlate to an amount of power consumed by at least a portion of the integrated circuit device.

In one embodiment, the method may include repetitively sampling, at a variable sampling rate based on a variable delay time, multiple signals within a portion of an integrated circuit device to obtain multiple energy values. The energy values may correspond to an amount of energy used by the portion of the integrated circuit device. As an example, the variable delay time may be a number of delay cycles that may be inserted between sample readings of the energy values for the multiple signals of the integrated circuit device. The power monitor may, due to the inserted variable delay times, sample the energy values at a variable sampling frequency. The method may further include generating, based on the obtained multiple energy values, a cumulative energy value for the integrated circuit device. For example, the power monitor may sum the multiple samples of the energy values to calculate the cumulative energy value for the integrated circuit device.

In one specific implementation, the variable delay time may be generated dependent on a pseudo-random value received from a pseudo-random number generator. As an example, the pseudo-random number generator may be implemented as a linear feedback shift register (LFSR). The pseudo-random number generator may provide pseudo-random values which the power monitor may use to insert a variable number of delay cycles between energy value sample readings.

Figure 1:
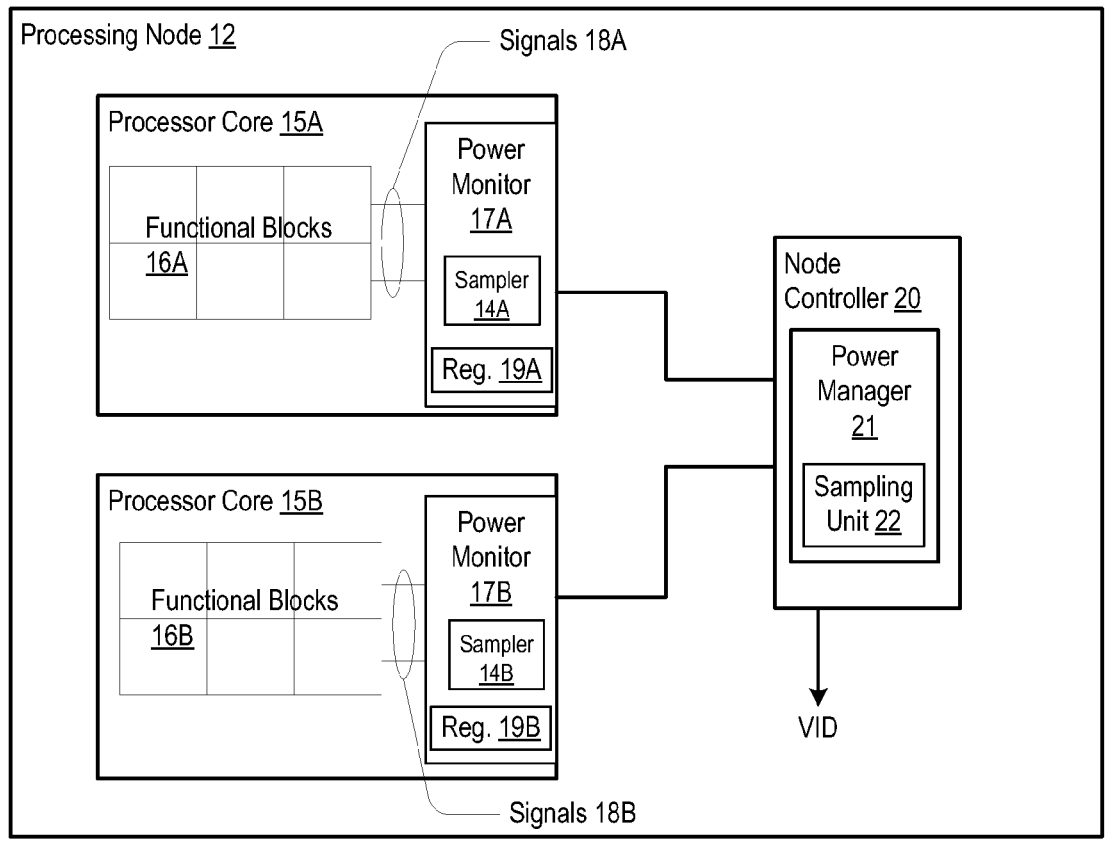
FIG. 1 is a block diagram of one embodiment of a processing node having processor cores with digital power monitors.

Specific embodiments are shown by way of example in the drawings and will herein be described in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six, interpretation for that unit/circuit/component.

DETAILED DESCRIPTION

Turning now to FIG. 1, a simplified block diagram of one embodiment of a processing node is shown. In the illustrated embodiment, the processing node 12 includes processor cores 15A-15B coupled to a node controller 20. In one embodiment, node 12 may be a single integrated circuit device comprising the circuitry shown therein in FIG. 1. That is, node 12 may be a chip multiprocessor (CMP). Other embodiments may implement the node 12 as two or more separate integrated circuits, as desired. Any level of integration or discrete components may be used. It is noted that components having a number and a letter as a reference designator may be referred to by the number only where appropriate. It is also noted that processor cores 15A-15B may be any type of processing element and may not be identical, nor even similar, to each other. For example, processor core 15A or 15B may a central processing unit (CPU) core, graphics processing unit (GPU) core, digital signal processing (DSP) core, application processor (AP) core, or any other core. Additionally, processor cores 15A and 15B may be any combinations thereof.

It is also noted that, a processing node such as node 12 may include any number of processor cores, in various embodiments. It is further noted that processor node 12 may include many other components that have been omitted here for simplicity. For example, in various embodiments processing node 12 may include an integral memory controller and various communication interfaces for communicating with other nodes, and I/O devices.

In one embodiment, node controller 20 may include various interconnection circuits (not shown) for interconnecting processor cores 15A and 15B to each other, to other nodes, and to a system memory (not shown). As shown, the node controller 20 includes a power manager 21 that may be configured to control the amount of power consumed by each processor core 15 and therefore, the amount of heat generated. The power manager 21 may be configured to control the operating frequency for each core and/or the power supply voltages for the node using the voltage identifier (VID) signals provided to the voltage regulator(s). In one embodiment, the maximum and minimum operating frequencies for the node and the maximum and minimum power supply voltages for the node may be provided via fuses that are blown during manufacture. In addition, as described further below, the power manager 21 may be configured to control the power consumed by each core based upon power estimates provided by the power monitors 17A and 17B within each of processor cores 15A and 15B, respectively.

Generally, a processor core (e.g., 15A-15B) may include circuitry that is designed to execute instructions defined in a given instruction set architecture. That is, the processor core circuitry may be configured to fetch, decode, execute, and store results of the instructions defined in the instruction set architecture. For example, in one embodiment, processor cores 15A-15B may implement the x86 architecture. The processor cores 15A-15B may comprise any desired configurations, including superpipelined, superscalar, or combinations thereof. Other configurations may include scalar, pipelined, non-pipelined, etc. Various embodiments may employ out of order speculative execution or in order execution. The processor core may include microcoding for one or more instructions or other functions, in combination with any of the above constructions. Various embodiments may implement a variety of other design features such as caches (e.g., L1 and L2 caches), TLBs, etc. These various design features and microarchitectural blocks described above are represented in FIG. 1 as functional blocks 16A and 16B of processor cores 15A and 15B, respectively.

In the illustrated embodiment, processor core 15A includes a power monitor 17A, which includes one or more storage elements (e.g., reg. 19A), for example. Power monitor 17A may also include sampler 14A. Likewise, processor core 15B includes a power monitor 17B, which also includes one or more storage elements (e.g., reg. 19B), for example. Power monitor 17B may also include sampler 14B. As described further below, each power monitor 17 may be configured to monitor energy values for multiple signals (e.g., 18A and 18B) within a corresponding processor core 15. More particularly, in one embodiment, sampler 14 of each power monitor 17 may be configured to monitor (e.g., sample) the activity factor or level of multiple, pre-determined signals within a corresponding core. In some embodiments, several hundred signals within a core 15 may be monitored by the sampler 14. The power monitor 17 may be configured to, for each signal, multiply the activity factor for the signal by a weight factor for the signal to determine an energy value for the signal. Each power monitor 17 may sum the resulting energy values for the monitored signals to obtain a cumulative energy value for a corresponding core 15. The cumulative energy value for a core 15 may be an estimate of the amount of energy used by the core 15. Power monitor 17 may store the cumulative energy value in register 19.

In addition, node 12 includes a power manager 21, which includes a sampling unit 22. Sampling unit 22 may be configured to sample the cumulative energy value obtained by sampler 14 for the core 15 at a fixed time sample interval. Each sample of the cumulative energy value may be an estimate of an amount of energy used by the portion of the integrated circuit device during the fixed time sample interval. Additionally, sampling unit 22 of power manager 21 may sample, at a same fixed time sample interval, the cumulative energy values for each core 15 in processing node 12. Power manager 21 may calculate, dependent on the sampled cumulative energy values, power consumption estimates for the cores 15 in processing node 12 and may sum the power consumption estimates to calculate a dynamic power consumption value for the processing node 12. In response to the core energy values, the power manager 21 may increase or decrease the frequency of one or more cores, increase or decrease the operating voltages of the cores, or otherwise control the operational state of the cores in an effort to optimize performance while staying within the thermal budget of the processing node 12.

As will be described in greater detail below in conjunction with the descriptions of FIG. 2, FIG. 3, and FIG. 4, in various embodiments, sampler 14 of power monitor 17 may be configured to sample the multiple signals within the core at a variable sampling frequency. As described above, sampler 14 may sample several hundred signals within a core 15. Sampling each signal during each operating cycle of the core (e.g., at a sampling frequency equivalent to the operating frequency of the core) may require significant hardware resources and may generate timing issues within the circuitry of the core. Furthermore, calculating the cumulative energy value for the core, as described above, may require a significant amount of computational resources since many energy value samples may be obtained by sampling each of signals at full frequency. To decrease the hardware and computational burden, sampler 14 may periodically sample the signals at a sampling frequency that is lower than the operating frequency of the core.

However, as a consequence, the periodic sampling frequency that may be used by sampler 14 to sample the signals may inadvertently match a software harmonic that may be induced by software algorithms executing within the core. More specifically, the sampling frequency may align with the frequency of a repetitive software loop. Sampling the energy value for signals within a core at a same point within a repetitive software loop may provide a consistently inaccurate representation of the energy usage, and, thus, the power consumption, of the core. Accordingly, sampler 14 may be configured to sample the multiple signals within the core at a variable sampling frequency. The variable sampling frequency may be generated by introducing variable amounts of delay between samples. More specifically, sampler 14 may stagger the amount of sample time between acquired samples to create a variable delay between samples. Such a variable delay may avoid sampling at a software frequency that may align with a software harmonic, and, as a result, produce a more accurate representation of energy usage for a core 15.

Figure 2:
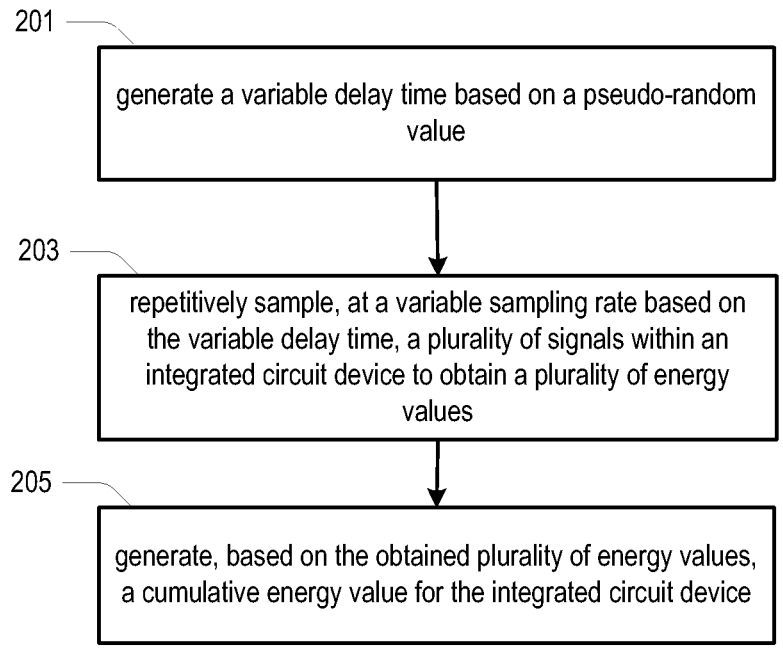
FIG. 2 is a flow diagram describing operational aspects of the sampler of FIG. 1.

Turning to FIG. 2, a flow diagram describing operational aspects of the sampler of FIG. 1 is shown. Referring collectively to FIG. 1 and FIG. 2, and beginning at block 201 of FIG. 2, the sampler 14 may generate a variable delay time based on a pseudo-random value. In one embodiment, sampler 14 may employ a pseudo-random number generator to generate the pseudo-random value. An example of a pseudo-random number generator that may be included in sampler 14 is shown in FIG. 3 and FIG. 4, and described in further detail below.

During operation, sampler 14 may repetitively sample, at a variable sampling rate that is based on the variable delay time, a set of signals within core 15 to obtain energy values for the set of signals within core 15 (203). The energy value for a signal may correspond to an amount of energy used by the portion of the integrated circuit device during operation. In one particular embodiment, the sampler 14 may monitor a set of signals of a corresponding core 15 to determine an activity level for each signal. The activity level for a signal may represent dynamic activity, or switching activity, of the core 15. Using the activity level for each signal and a respective weight for each signal, power monitor 17 may calculate an energy value for core 15. As an example, power monitor 17 may store the calculated energy value in a storage location within core 15, such as in register 19.

As described above, sampler 14 may sample the set of signals at a sampling frequency that is lower than the operating frequency of the core 15, which may reduce the hardware and computational expense of the sampling circuitry for the core 15. However, if the sample frequency aligns with a repetitive software loop that may be executing within the core, the sampler may provide an inaccurate representation of energy use within the core. Accordingly, the sampler 14 may use the variable sample rate to avoid aligning the sampling frequency with a repetitive software loop. The variable sampling frequency may be generated by inserting the variable delay time between samples of the set of signals. As an example, sampler 14 may include a delay counter which may be configured to, based on the pseudo-random value, insert a variable delay time between energy value samples. An exemplary delay counter that may be included in sampler 14 is illustrated in FIG. 3 and described in further detail below.

As energy values are obtained, a cumulative energy value for the integrated circuit device may be generated based on the obtained plurality of energy values (205). For example, power monitor 17 may be configured to generate a cumulative energy value for core 15 from the multiple energy value samples obtained by sampler 14. As described above, power monitor 17, or sampler 14, may store each obtained energy value, for example, in a register such as register 19. Power monitor 17 may generate the cumulative energy value by adding each successively obtained energy value to the value stored in register 19. Accordingly, a storage location such as register 19 may hold a value which represents a cumulative energy value, obtained over a period of time, for a core 15.

Figure 3:
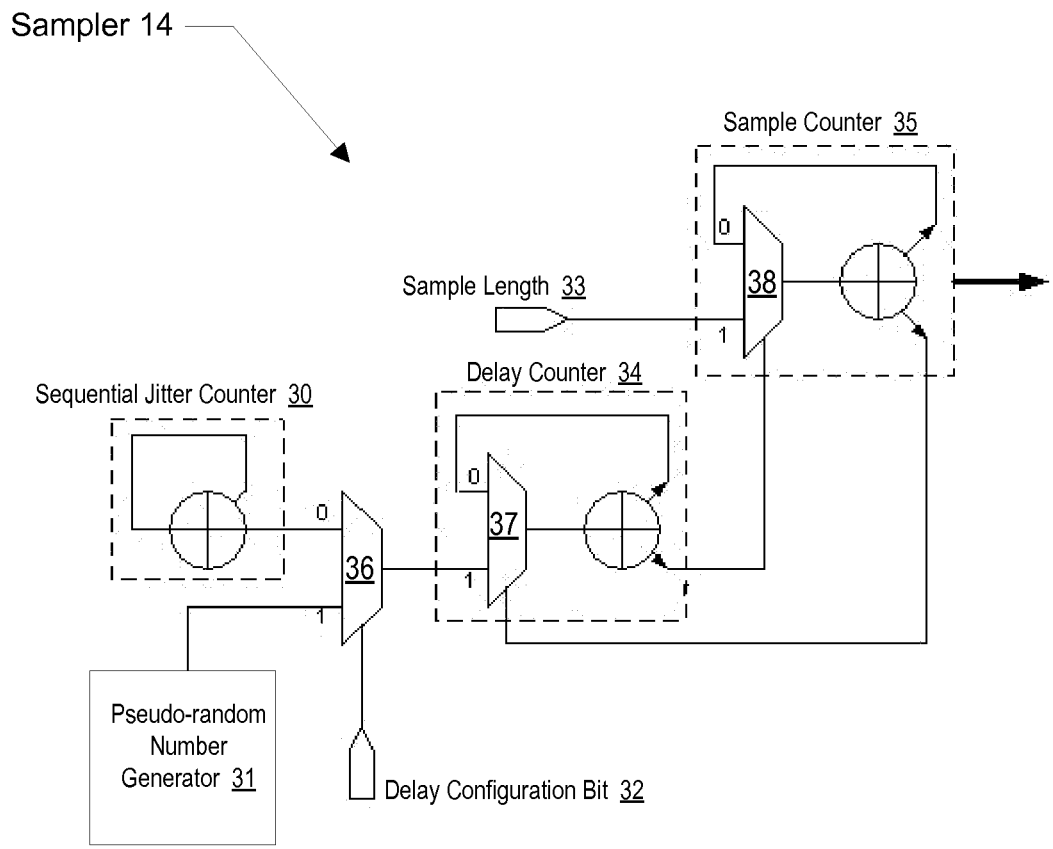
FIG. 3 is a block diagram of one embodiment of the sampler of FIG. 1.

Turning now to FIG. 3, a simplified block diagram of one embodiment of a sampler 14 within the power monitor 17 of FIG. 1 is shown. In the illustrated embodiment, the sampler 14 includes a sequential jitter counter 30 and a pseudo-random number generator 31, which are coupled to a delay counter 34 through a multiplexer 36. The delay counter 34 is coupled to a sample counter 35 which provides the sampler output.

Sequential jitter counter 30 may generate a predictable value, while the pseudo-random number generator 31 may generate a pseudo-random value. An exemplary implementation of pseudo-random number generator 31 is illustrated in FIG. 4 and described in further detail below. It is noted that other implementations of pseudo-random number generator 31 are possible and contemplated.

As illustrated in FIG. 3, sampler 14 includes a delay configuration bit 32 that selects the output of either the sequential jitter counter 30 or the pseudo-random number generator 31. In one particular embodiment, delay configuration bit 32 may be a software programmable bit. For example, delay configuration bit 32 may be a particular bit of a configuration register associated with power manager 21. The configuration register may be implemented as a hardware configuration register or a software configuration register. Dependent on the value of delay configuration bit 32, either sequential jitter counter 30 or pseudo-random number generator 31 may provide a value to delay counter 34. Delay counter 34 is configured to determine an amount of variable delay time that is inserted between samples dependent on the value provided by multiplexer 36. Accordingly, delay configuration bit 32 may select whether the variable delay time is generated based on the pseudo-random value from pseudo-random number generator 31 or based on the predictable value from sequential jitter counter 30. The variable delay value (i.e., seed) provided to delay counter 34 may determine a number of delay cycles between samples of the set of signals. A delay cycle may correspond to an operating clock cycle of core 15.

In the embodiment of FIG. 3, sample counter 35 may, dependent on the value of sample length 33, determine a number of cycles that may be included in an energy value sample. In one particular embodiment, sample length 33 may be a value stored in a register associated with power manager 21. For example, power manager 21 may include a configuration register which may store the value of sample length 33. The configuration register may be implemented as a hardware configuration register or a software configuration register. In one embodiment, sampler 14 may include an eight-bit sample chain (not shown) which may store the sampled activity levels of the set of signals. The eight-bit sample chain value may represent the energy value sample for the core 15. The energy value may be read by shifting the stored values out of the sample chain every eight clock cycles. Sample counter 35 may provide the count for shifting the stored values out of the sample chain during eight clock cycles of core 15.

Delay counter 34 may provide a signal to sample counter 35 that may determine when a cycle count for an energy sample may begin. More specifically, delay counter 34 may delay the sample count of sample counter 35 by a particular number of cycles. Accordingly, delay counter may insert a variable delay (e.g., variable number of delay cycles) between energy value samples by delaying the sample count of sample counter 35. The amount of delay inserted by delay counter 34 may be dependent on the delay value provided to delay counter 34 by sequential jitter counter 30 or pseudo-random number generator 31. Delay counter 34 may receive a delay value and may count down a number of clock cycles equal to the delay value before sending a signal for sample counter 35 to initiate a cycle count for an energy sample.

As a specific example, sample counter 35 may count eight clock cycles to enable eight bits to be shifted out of the sample chain for an energy value reading. The energy value of the sample chain may be read during the next, or ninth, consecutive clock cycle. Sample counter 35 may then wait a number of cycles, dependent on delay counter 34, before beginning the next cycle count. Delay counter 34 may receive a delay value of three from either sequential jitter counter 30 or pseudo-random number generator 31. Delay counter 34 may count down three cycles before providing a signal to sample counter 35 which indicates that the next sample count may begin. Accordingly, sample counter 35 may wait during the $10^{th}$, $11^{th}$ and $12^{th}$ consecutive cycles (e.g., three cycles of delay) and may begin the next sample count on the $13^{th}$ consecutive cycle. As another specific example, for a delay count of one cycle, sample counter 35 may begin a next sample count on the 10th clock cycle.

As described above, either sequential jitter counter 30 or pseudo-random number generator 31 may provide a delay value to delay counter 35 that may determine the number of cycles between energy value sample readings. The pseudo-random delay value may result in a variable amount of delay between energy value sample readings. The variable amount of delay between energy value sample readings may effectively create a variable sampling frequency that may avoid alignment with repetitive software loops, or software harmonics.

In contrast, sequential jitter counter 30 may provide a predictable delay value. More particularly, sequential jitter counter 30 may provide delay counter 34 with a consistent, known sequence of delay values. For example, in one embodiment, sequential jitter counter 30 may repeatedly cycle between delay values three, two, one, and zero. In such an example, sequential jitter counter 30 may cause delay counter 34 to follow a predictable, repetitive pattern. For example, delay counter 34 may insert three delay cycles between two sample readings, two delay cycles between the next two sample readings, one delay cycle between the next two sample readings and then zero delay cycles between the next two sample cycles. Delay counter 34 may then repeat the pattern of delay cycles, starting again at three delay cycles. In some embodiments the variable delay value may be turned off, or set to zero, such that no delay cycles are introduced between samples. Accordingly, in such a case the sample rate used by sampler 14 to obtain energy values may be a fixed sample rate. A fixed sample rate may enable effective troubleshooting and/or debug of the operation of sampler 14.

Figure 4:
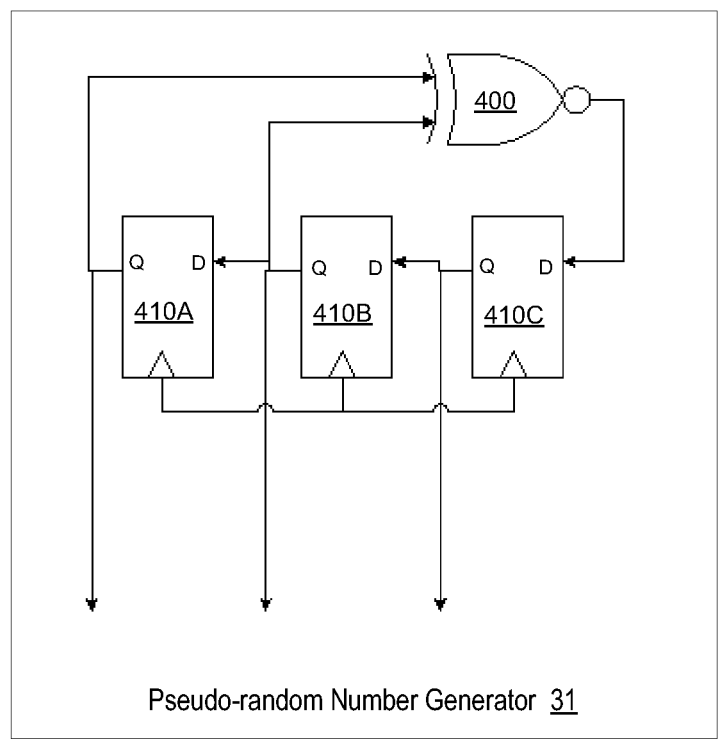
FIG. 4 is a block diagram of one embodiment of the pseudo-random number generator of FIG. 3.

Turning to FIG. 4, a block diagram of one embodiment of the pseudo-random number generator of FIG. 3 is shown. The pseudo-random generator 31 may be implemented as a shift register that includes exclusive-NOR gate 400 and a flip-flops 410A through 410C. This circuit may also be referred to as a linear feedback shift register (LFSR). The LFSR may have a finite number of possible states and may produce values that are dependent on a previous state of the LFSR. Accordingly, the LFSR may produce a pseudo-random output which may eventually enter a repeating pattern. The ranges of pseudo-random values produced by the LFSR may be determined by the number of stages included in the LFSR. The example LFSR illustrated in FIG. 4 includes three stages. Although the pseudo-random number generator 31 of FIG. 3 is shown as an LFSR having three stages, it is contemplated that in other embodiments pseudo-random number generator 31 may have any number of stages.

It is noted that although various components described above are described in terms of hardware implementations, it is contemplated that in other embodiments any of these hardware implementations may be implemented in hardware, software, firmware, or any combination thereof.

Figure 5:
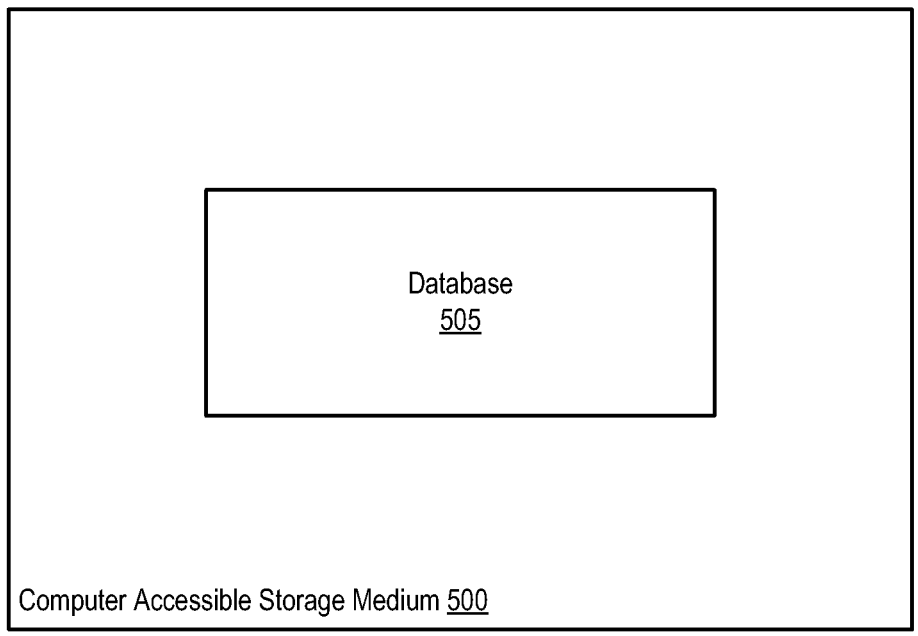
FIG. 5 is a block diagram of a computer accessible storage medium including a database representative of the processing node of FIG. 1.

Turning to FIG. 5, a block diagram of a computer accessible storage medium 500 including a database 505 representative of the processing node 12 of FIG. 1 is shown. Generally speaking, a computer accessible storage medium 500 may include any non-transitory storage media accessible by a computer during use to provide instructions and/or data to the computer. For example, a computer accessible storage medium 500 may include storage media such as magnetic or optical media, e.g., disk (fixed or removable), tape, CD-ROM, or DVD-ROM, CD-R, CD-RW, DVD-R, DVD-RW, or Blu-Ray. Storage media may further include volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media may include microelectromechanical systems (MEMS), as well as storage media accessible via a communication medium such as a network and/or a wireless link.

Generally, the database 505 of the processing node 12 carried on the computer accessible storage medium 500 may be a database or other data structure which can be read by a program and used, directly or indirectly, to design or fabricate the hardware comprising the processing node 12. For example, the database 505 may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates which also represent the functionality of the hardware comprising the processing node 12. The netlist may then be placed and routed to produce a data set describing geometric shapes to be applied to masks. The masks may then be used in various semiconductor fabrication steps to produce a semiconductor circuit or circuits corresponding to the processing node 12. Alternatively, the database 505 on the computer accessible storage medium 500 may be the netlist (with or without the synthesis library) or the data set, as desired.

While the computer accessible storage medium 500 carries a representation of the processing node 12, other embodiments may carry a representation of any portion of the processing node 12, as desired.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A system comprising:
   a processor core of an integrated circuit device, wherein the processor core includes a power monitor configured to:
      repetitively sample, at a variable sampling rate based upon a variable delay time, a plurality of signals within at least a portion of the integrated circuit device to obtain a plurality of energy values, wherein each energy value represents an amount of energy used by the at least a portion of the integrated circuit device during operation;
      generate, based upon the obtained plurality of energy values, a cumulative energy value for the at least a portion of the integrated circuit device; and
   a delay counter configured to generate the variable delay time based upon a software programmable delay configuration value, wherein the delay configuration value determines whether the variable delay time is generated using a pseudo-random value or whether the variable delay time is generated using a predictable value.

2. The system as recited in claim 1, further including:
a pseudo-random number generator configured to generate the pseudo-random value;
a sequential jitter counter configured to generate the predictable value.

3. The system as recited in claim 2, wherein the pseudo-random number generator comprises a linear feedback shift register (LFSR).

4. The system as recited in claim 1, wherein the variable delay time corresponds to a number of delay cycles between samples of the plurality of signals, and wherein a delay cycle corresponds to a clock cycle of the at least a portion of the integrated circuit device.

5. The system as recited in claim 1, wherein the power monitor is further configured to set the variable delay time to a fixed value and to generate a fixed sampling rate based upon the set variable delay time.

6. The system as recited in claim 1, wherein the power monitor is further configured to generate the cumulative energy value by adding each obtained energy value to a sum of energy values, wherein the sum of energy values corresponds to the cumulative energy value.

7. The system as recited in claim 1, wherein the integrated circuit device includes a power management unit configured to calculate an estimated amount of power consumed by the at least a portion of the integrated circuit device based on the cumulative energy value generated by the power monitor.

8. The system as recited in claim 1, wherein the processor core is one of a plurality of processor cores of the integrated circuit device.

9. A non-transitory computer readable medium storing a data structure which is operated upon by a program executable on a computer system, the program operating on the data structure to perform a portion of a process to design or fabricate an integrated circuit including circuitry described by the data structure, the circuitry described in the data structure including:
a processor core of the integrated circuit, wherein the processor core includes a power monitor configured to:
repetitively sample, at a variable sampling rate based upon a variable delay time, a plurality of signals within at least a portion of the integrated circuit to obtain a plurality of energy values, wherein each energy value represents an amount of energy used by the at least a portion of the integrated circuit during operation;
generate, based upon the obtained plurality of energy values, a cumulative energy value for the at least a portion of the integrated circuit;
generate the variable delay time based upon a software programmable delay configuration value, wherein the delay configuration value determines whether the variable delay time is generated using a pseudo-random value or whether the variable delay time is generated using a predictable value.

10. The non-transitory computer readable medium as recited in claim 9, further including:
a pseudo-random number generator configured to generate the pseudo-random value;
a sequential jitter counter configured to generate the predictable value.

11. The non-transitory computer readable medium as recited in claim 10, wherein the pseudo-random number generator comprises a linear feedback shift register (LFSR).

12. The non-transitory computer readable medium as recited in claim 9, wherein the variable delay time corresponds to a number of delay cycles between samples of the plurality of signals, and wherein a delay cycle corresponds to a clock cycle of the at least a portion of the integrated circuit device.

13. The non-transitory computer readable medium as recited in claim 9, wherein the power monitor is further configured to set the variable delay time to a fixed value and to generate a fixed sampling rate based upon the set variable delay time.

14. The non-transitory computer readable medium as recited in claim 9, wherein the power monitor is further configured to generate the cumulative energy value by adding each obtained energy value to a sum of energy values, wherein the sum of energy values corresponds to the cumulative energy value.

15. The non-transitory computer readable medium as recited in claim 9, wherein the integrated circuit includes a power management unit configured to calculate an estimated amount of power consumed by the at least a portion of the integrated circuit based on the cumulative energy value generated by the power monitor.

16. A method comprising:
repetitively sampling, by a power monitor of an integrated circuit, at a variable sampling rate based upon a variable delay time, a plurality of signals within at least a portion of the integrated circuit device to obtain a plurality of energy values, wherein each energy value corresponds to an amount of energy used by the at least a portion of the integrated circuit device during operation;
generating, by a power monitor of an integrated circuit, based upon the obtained plurality of energy values, a cumulative energy value for the at least a portion of the integrated circuit device;
generating the variable delay time based upon a software programmable delay configuration value, wherein the delay configuration value determines whether the variable delay time is generated using a pseudo-random value or whether the variable delay time is generated using a predictable value.

17. The method as recited in claim 16, further comprising:
generating the pseudo-random value using a pseudo-random number generator;
generating the predictable value using a sequential jitter counter.

18. The method as recited in claim 17, wherein the pseudo-random number generator comprises a linear feedback shift register (LFSR).

19. The method as recited in claim 16, wherein the variable delay time corresponds to a number of delay cycles between samples of the plurality of signals, and wherein a delay cycle corresponds to a clock cycle of the at least a portion of the integrated circuit device.

20. The method as recited in claim 16, further comprising setting the variable delay time to a fixed value and generating a fixed sampling rate based upon the set variable delay time.

21. The method as recited in claim 16, further comprising generating the cumulative energy value by adding each obtained energy value to a sum of energy values, wherein the sum of energy values corresponds to the cumulative energy value.

22. The method as recited in claim 16, further comprising calculating an estimated amount of power consumed by the at least a portion of the integrated circuit device based on the cumulative energy value, using a power management unit of the integrated circuit device.

* * * * *